(12) United States Patent
Li et al.

(10) Patent No.: US 6,205,645 B1
(45) Date of Patent: *Mar. 27, 2001

(54) TENSIONING PROCESS FOR MANUFACTURE OF SUPERCONDUCTING CERAMIC COMPOSITE CONDUCTORS

(75) Inventors: Qi Li, Waltham; Craig J. Christopherson, South Grafton; Gilbert N. Riley, Jr., Marlborough; William L. Carter, Chelmsford; William J. Michels, Brookline; Eric R. Podtburg, Natick; Lawrence J. Masur, Needham, all of MA (US)

(73) Assignee: American Superconductor Corporation, Westborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/652,624

(22) Filed: May 21, 1996

(51) Int. Cl.$^7$ .................................................. H01L 39/24
(52) U.S. Cl. ............................ 29/599; 72/42; 72/282; 505/430; 505/431; 505/433
(58) Field of Search ..................... 505/430, 431, 505/433; 72/42, 282

(56) References Cited

U.S. PATENT DOCUMENTS 2,088,040  7/1937  Simons et al. .

FOREIGN PATENT DOCUMENTS

| 0 504 908 A1 | 9/1992 | (EP) . |
| 0 710 993 A1 | 5/1996 | (EP) . |
| WO 96/39366 | 12/1996 | (WO) . |

Primary Examiner—Carl J. Arbes
(74) Attorney, Agent, or Firm—Choate, Hall & Stewart

(57) ABSTRACT

The combination of one or more high reduction drafts with controlled, low back tensions increases the range of deformation conditions over which dimensional tolerances and $J_e$ may be optimized. The method comprises the steps of: first, providing a precursor article comprising a metal matrix surrounding a plurality of filaments extending along the length of the article and comprising precursors to a desired superconducting ceramic; next, roll working the precursor article during a breakdown stage at a back tension less than the elastic to plastic transition threshold of the composite during at least one high reduction roll working draft, and, then, sintering the rolled article to obtain the desired superconducting ceramic. In a preferred embodiment, the rolling step further comprises rolling the article at a front tension less than the elastic to plastic transition threshold of the rolled, unsintered article.

21 Claims, 9 Drawing Sheets

TENSIONING PROCESS FOR MANUFACTURE OF SUPERCONDUCTING CERAMIC COMPOSITE CONDUCTORS

FIELD OF THE INVENTION

This invention relates to a process for converting multifilamentary superconducting ceramic precursors into textured and densified superconducting ceramic composite articles and to the resulting articles. More particularly, it relates to a method of tensioning the precursor during certain stages of the manufacturing process, which increases the efficiency of conventional deformation processing techniques used in texturing superconducting composite articles and improves the physical uniformity and performance of the resulting article.

BACKGROUND OF THE INVENTION

Since the discovery of oxide superconducting materials with transition temperatures above about 20 Kelvins, the possibility of using them to obtain greater efficiency in electrical and magnetic applications has attracted considerable interest.

Although superconducting oxides have complex, brittle, ceramic-like structures which cannot by themselves be drawn into wires or similar conductor forms using conventional metal-processing methods, progress has been made in manufacturing superconducting oxide conductors with high engineering current capacity as composite structures in which the superconducting oxides are supported by a matrix material, typically a noble metal, which adds mechanical robustness to the composite. In preferred manufacturing processes such as the "PIT" process, in both its oxide precursor and metallic precursor variations, and coated conductors, the desired superconducting oxide is formed within or upon the supporting matrix by a combination of phase transformation and oxidation reactions which occur during the manufacturing process. For example, the well-known powder-in-tube ("PIT") process, which is used to prepare composites in elongated forms such as wires, tapes and cables, includes the steps of: (a) forming a powder of superconductor precursor material; (b) filling a metal container, such as a tube, billet, or grooved sheet, with precursor powder and deformation processing one or more filled containers to provide a composite of reduced cross-section including one or more filaments of superconductor precursor material in a surrounding metal matrix; and (c) further thermomechanically processing the composite to form and sinter filament material having the desired superconducting properties. Multifilamentary composites with the desired number of filaments may be obtained by successive rebundling or cabling iterations, with additional deformation and thermomechanical processing steps as needed.

A key requirement for improving the current-carrying capacity ($J_c$) of polycrystalline superconducting ceramics is a high degree of densification and crystallographic alignment or texture of the superconducting grains. In conventional PIT processing, an initial deformation stage, commonly called the breakdown stage, is used to reduce a large diameter, low density precursor composite to a highly aspected, high density tape, cable or wire via one or more deformation drafts. Total reductions in excess of 40% during the breakdown stage are common. During the breakdown stage, the grains of the precursor phases are densified and physically aligned in relation to the direction of elongation, namely primarily such that the c-directions of the grains are aligned orthogonally to the desired current direction along the composite axis, which promotes good intergrain electrical connectivity after phase conversion. In fine multifilamentary composites, the breakdown stage also forms the basic shape and cross-section of the filaments in order to promote reaction induced texture during subsequent heat treatments. Flat, evenly shaped filaments in which one dimension of the filament is no greater than about the longest dimension of the desired superconducting grains have been found to provide improved $J_c$ performance. Additional intermediate deformation stages, typically at low reductions, may be used after the breakdown stage to reduce the severity of reaction induced defects in the textured superconductor phases and to modulate the mosaic spread of its grains in order to further improve its texture. Between deformation stages, reaction sintering heat treatments are used to convert the oxide particle fragments of the precursor to the desired superconductor or to an intermediate phase, typically also a superconductor, to heal cracks induced by deformation, and to promote texturing by enhancing the anisotropic growth of the superconducting grains. This type of uni-axial texturing has been particularly well developed for the PIT fabrication of the micaceous bismuth-strontium-calcium-copper-oxide (BSCCO) 2223 and 2212 superconducting phases ($Bi_2Sr_2Ca_2Cu_3O_{10-x}$ and $Bi_2Sr_2Ca_1Cu_2O_{8-x}$ respectively), because these oxides exhibit a modest amount of plastic deformation via the activation of the a-b plane slip systems, although it has also been applied with modest success to the rare earth-containing superconducting copper oxides, the thallium-containing superconducting copper oxides and the mercury-containing superconducting copper oxides. Typical prior art processes use a breakdown stage followed by one to four intermediate stages for a total of two to five iterations, each typically involving multiple deformation drafts, although processes employing a breakdown stage with a single draft and, in one embodiment, no further iterations, have also been disclosed. See, for example, co-pending application U.S. Ser. No. 08/468,089, (US '089) filed Jun. 6, 1995 and entitled "Improved Deformation Process for Superconducting Ceramic Composite Conductors", which is herein incorporated in its entirety by reference. The deformation sequence may be designated by the term "nDS", in which "D" refers to the deformation step, "S" refers to the sintering or heating step and "n" refers to the number of iterations. Common deformation techniques in nDS processes include extrusion, drawing, roll working, or pressing. The various forms of roll working, such as strip rolling, groove rolling, rod rolling, cover rolling, and turk's heading, are particularly well-suited for continuous processing of long lengths of superconducting material, such as wire, tape or cable. Like many "nDS" techniques, the approach described in US '089 also has an extremely sensitive process response surface, with small variations from optimum processing parameters creating high dimensional variations and large decreases in $J_c$. This creates difficulties for large scale manufacturing, as extremely precise control over deformation conditions is hard to maintain over extremely long lengths of wire, cable or tape.

However, to be practical outside the laboratory, most electrical and magnetic applications require that the conductor be manufacturable to precise dimensions at reasonable cost, in addition to having high current-carrying capacity. Long, flexible conductors with specific geometries and low dimensional variations are needed in many applications, including coils, rotating machinery and long length cables. In comparison to conventional conductors of comparable cross-section, high performance superconducting ceramic composites are quite difficult to manufacture to precise specifications and tolerances because of the complexity of the manufacturing process, the number of in situ chemical reactions involved, and the difficulty in predicting the interactions between the components of the composite during the various deformation stages.

Deformation processing of any material is complex. Standard metal-working processes have both imposed stress and imposed displacement boundary conditions. In roll working, for example, standard process parameters that control these conditions include front and back tension, roll diameter, reduction, and friction coefficient. See, e.g. Avitzur, "Handbook of Metal-Forming Processes", Ch. 13 for a discussion of the non-linear interactions of process parameters for roll working in the simplest case, that of deformation of a pure metal in a system where lateral spread of the metal cannot take place. The influence of some process parameters, such as roll diameter and friction, is not easily predicted. However, for pure metals, certain parameters, such as tension, will most directly influence stress and others, such as reduction, will most directly influence strain. Thus, high front and back tensions are conventionally used in the manufacture of metal wires to improve control of wire dimensions. Up to the yield strength of the metal, higher tensions are associated with lower dimensional variations in the wire.

The situation is more complex in a composite material for which there are discontinuities in materials parameters at each internal interface between one material and another. Where there are significant differences in mechanical properties, such as hardness, between the two materials, as there are between superconducting ceramics and typical matrix materials, the composite architecture can be very important in determining the dominant effects. Moreover, the material properties and processing parameters can interact in unpredictable ways. For example, deformation of a precursor powder may increase its structural integrity over time due to compaction, or decrease it due to breakup of the powder grains and/or macroscopic shear failure.

For superconducting ceramics, the constraints of the manufacturing process limit the ranges over which many process and product parameters may be varied if a composite with high $J_c$ is to be obtained. For example, the composite architecture and starting dimensions are constrained by the need for uniform heating and oxygenation of the ceramic filaments throughout the composite cross-section. Without this uniformity, poor precursor conversion reactions result in composites with lower $J_c$s. High reductions, particularly during the breakdown pass, have been associated with improved texturing and filament density, but excessive reductions have been associated with cracking (cf '089 and co-pending application U.S. Ser. No. 08/651,688 filed of even date and entitled "Improved Breakdown Process for Superconducting Ceramic Composite Conductors", which is herein incorporated in its entirety by reference), so the acceptable range of reduction factors may be quite narrow. Moreover, as mentioned above, optimum $J_c$s are obtained when the filament cross-section in the finished composite falls within certain narrow bounds determined by the grain size of the superconducting material. Delicate balancing of the composite geometry and reduction factor is needed just to achieve the desired filament cross-section, without regard to precise control of other composite dimensions. Roll diameter and friction have been identified as important factors in obtaining suitable core density and avoiding composite defects, so appropriate choices for these parameters may also be quite limited.

Low dimensional variations are a key product specification for many applications of superconducting ceramic composites, such as coils and cables. In conventional wire processing, high front and back tensions are known to produce low dimensional variation, but in superconducting ceramic composites, excessive tension has been shown to lead to strain localization which causes poor filament uniformity and reduced $J_c$.

Therefore, it is an object of this invention to provide a method for forming a high performance superconducting ceramic composite article having low dimensional variation, good filament uniformity, and high $J_c$ over long lengths.

It is a further object of this invention to provide a method for controlling the dimensional variation of a multifilamentary superconducting article which is effective despite variations in processing conditions typical of large-scale manufacturing operations, and which may be used to optimize composite uniformity at reasonable cost and in a limited number of processing steps.

SUMMARY OF THE INVENTION

The inventors have found that roll working the composite precursor in a high reduction draft at a non-negligible back tension below a threshold level in the breakdown stage of deformation processing improves the composite homogeneity, and decreases the dimensional variability of the resulting superconducting composite. Superconducting composites made by this method exhibit higher $J_c$s than composites made by prior art methods. Preferably, a high front tension may be applied during the draft in combination with the low back tension.

In one aspect, the invention is a method for manufacturing a multifilamentary superconducting ceramic composite article comprising the steps of: first, providing a precursor article comprising a plurality of filaments extending along the length of the article and containing precursors to a desired superconducting ceramic, and a metal matrix substantially surrounding the filaments; next, roll working the precursor article during a breakdown stage at a back tension less than the elastic to plastic transition threshold of the precursor article during at least one high reduction roll working draft and, then, sintering the rolled article to obtain the desired superconducting ceramic.

By "roll working", as that term is used herein, is meant the process of passing a precursor article such as a round wire or rectangular tape through a constrained gap of one or more, i.e., a pair or a four-way turks head arrangement, of rollers, so that deformation and reduction in at least one lateral dimension of the article results. By "draft" as that term is used herein, is meant the reduction in thickness of an elongated superconducting article in a single deformation operation, and by "high reduction roll working draft" is meant a roll working draft in which a reduction on the order of 40% to 95% is achieved. A "stage" as that term is used herein, comprises one or more successive drafts, with or without roll working but without intermediate sintering operations.

It is preferred that the total reduction achieved in the breakdown stage be on the order of 40% to 95%. Most preferably, a single high reduction roll working draft is used during the breakdown stage and no further reduction of the article in excess of about 10% (preferably less than 5%) occurs after the high reduction roll working draft and before the first sintering operation. By "no further reduction of the article in excess of about 10% occurs after the high reduction roll working draft" it is meant that no other deformation processing occurs during the breakdown stage after the high reduction roll working draft and before the sintering step.

However, it is contemplated that the breakdown stage may be the initial step in an nDS process where n is greater than 1, so that additional deformation, including lubricated or unlubricated roll working, and sintering steps may occur in other DS steps and still be within the scope of this invention. In addition, other processing operations may be contemplated at this stage and, of course, later stages, of the process including an ODS (oxide dispersion strengthening) treatment, anneals, shaping, machining, cabling, coiling, winding or other chemical or mechanical processing.

It is preferred that the deformation process be an nDS process, where n is no greater than 5. In one aspect, it is preferred that n be 1, i.e., that the breakdown stage be the last stage in which significant deformation of the article occurs, although minor deformation incidental to other operations such as finishing, forming or cabling may of course occur thereafter. In another aspect, it is preferred that n be equal to 2 or 3, that the total reduction achieved during the breakdown stage be on the order of 40% to 95%, and that the total reduction achieved in the intermediate stages be on the order of 2% to 40%, and preferably on the order of 2% to 25%.

By "sintering", as that term is used herein, is meant heat treatment of the composite precursor article under conditions sufficient to convert a portion of the precursor into the desired superconducting ceramic. Where the desired superconducting ceramic is BSCCO 2223, sintering preferably includes heating at a first temperature in the range of 800–850° C., heating at a second temperature in the range of 700–840° C. and heating at a third temperature in the range of 600–800° C. Sintering includes heating at an oxygen partial pressure of 0.0001 to 100 atm. By "anneal" is meant a heat treatment under conditions which create no substantial phase changes in the desired superconducting oxide or its precursor.

The invention provides multifilamentary superconducting composite articles and rolled precursor articles with improved dimensional uniformity and $J_c$. The rolled precursor article and resulting superconducting ceramic composite article are preferably elongated forms such as wires, tapes, cables, or current leads, and may comprise twisted or untwisted filaments. The invention may be practiced with the precursors of any desired superconducting ceramic which requires texturing and may be entirely or partially textured by deformation. The compounds are preferably precursors of superconducting oxides, and particularly of the bismuth, rare earth, thallium, lead or mercury families of superconducting copper oxides. Precursors of the bismuth family, and particularly its 2212 and 2223 phases, are most preferred. Precursors of the yttrium rare earth family, and particularly its 123, 124, and 247 phases are also preferred. By "precursor" is meant any material that can be converted to a desired superconducting ceramic upon application of a suitable heat treatment. Where a superconducting oxide is the desired superconducting ceramic, for example, precursors may include any combination of elements, metal salts, oxides, suboxides, oxide superconductors which are intermediate to the desired oxide superconductor, or other compounds which, when reacted in the presence of oxygen in the stability field of a desired oxide superconductor, produces that superconductor.

In preferred embodiments, the metal matrix includes a noble metal. By "noble metal" is meant a metal whose reaction products are thermodynamically unstable under the reaction conditions employed relative to the desired superconducting ceramic, or which does not react with the superconducting ceramic or its precursors under the conditions of manufacture of the composite. The noble metal may be a metal different from the metallic elements of the desired superconducting ceramic, such as silver, oxide dispersion strengthened (ODS) silver, or a silver/gold alloy, but it may also be a stoichiometric excess of one of the metallic elements of the desired superconducting ceramic, such as copper. Silver (Ag), ODS silver, and silver alloys are the most preferred noble metals.

The back tension during each high reduction roll working draft is preferably greater than about 0.2 MPa, and most preferably greater than 0.5 MPa. The maximum back tension is determined by the threshold of the elastic to plastic transition of the precursor article. For multifilamentary composites with a soft matrix, such as pure silver, the back tension during each high reduction roll working draft is preferably less than about 15 MPa. For hardened matrix materials such as ODS silver, larger back tensions, up to about 30 MPa, may be used. Front tensions of up to 5 times, and preferably about 3 times the selected back tension may be beneficially used in combination with the low back tension. The maximum front tension is determined by the threshold of the elastic to plastic transition of the rolled, unsintered article. Back tensions are calculated based on the cross-section of the composite precursor prior to the roll working draft, while front tensions are calculated based on the cross-section of the composite precursor after the roll working draft.

BRIEF DESCRIPTION OF THE DRAWINGS

The foregoing and other features, objects, aspects and advantages of the invention will become more apparent from the detailed description of the preferred embodiments which follows, and from the drawings, in which.

DETAILED DESCRIPTION OF THE PREFERRED EMBODIMENTS

Figure 1:
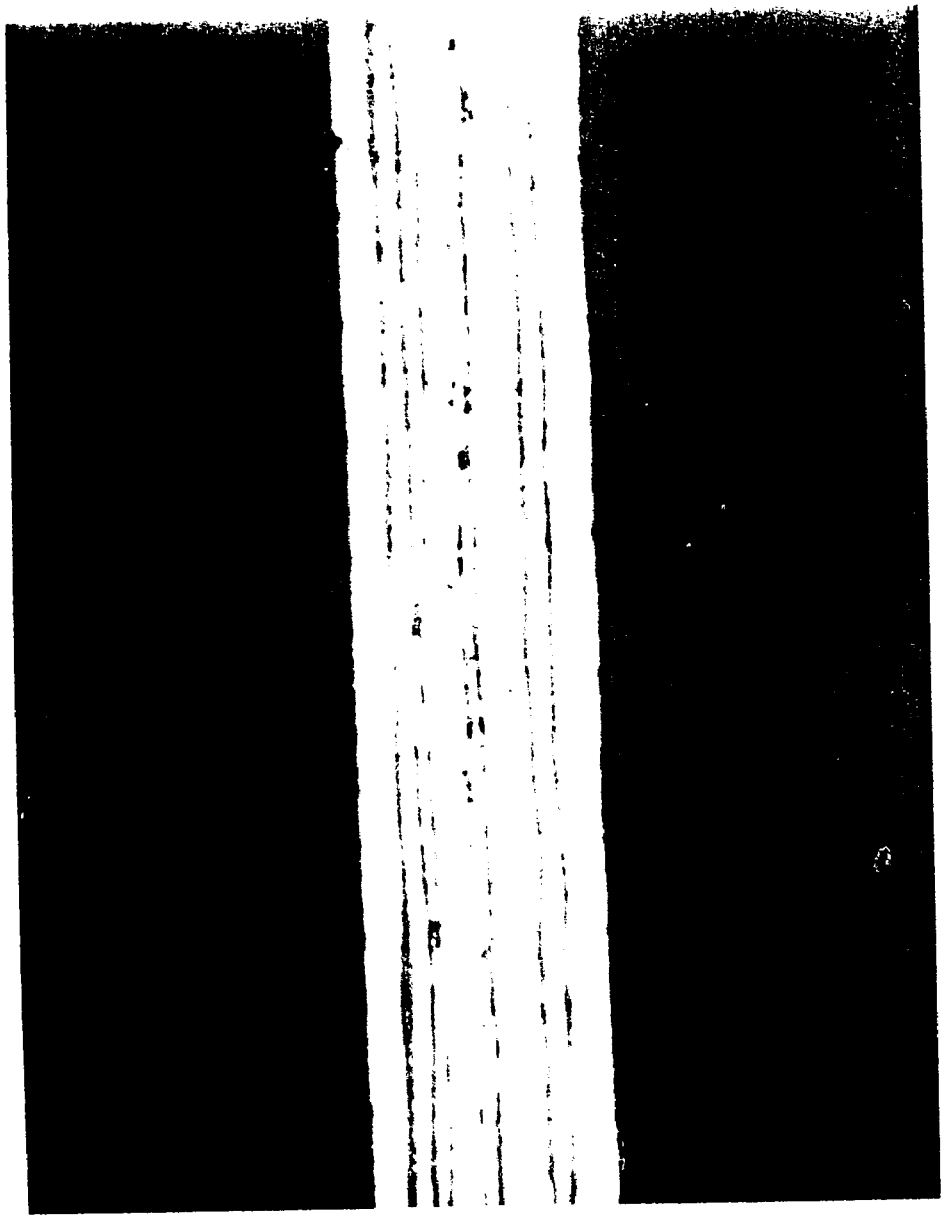
FIG. 1 is an optical photomicrograph of a longitudinal cross-sections of an elongated superconducting ceramic made in accordance with the invention.

The inventors have found that controlling back tension during a high reduction breakdown roll working draft results in marked improvements in product quality. FIG. 1 is an optical photomicrograph (150 times magnified) of a longitudinal cross-section of an elongated superconducting ceramic made in accordance with the invention. In the optical photomicrograph, black regions are precursor filaments and white regions are matrix material. The composite exhibits superior dimensional uniformity without significant cracking.

Figure 5:
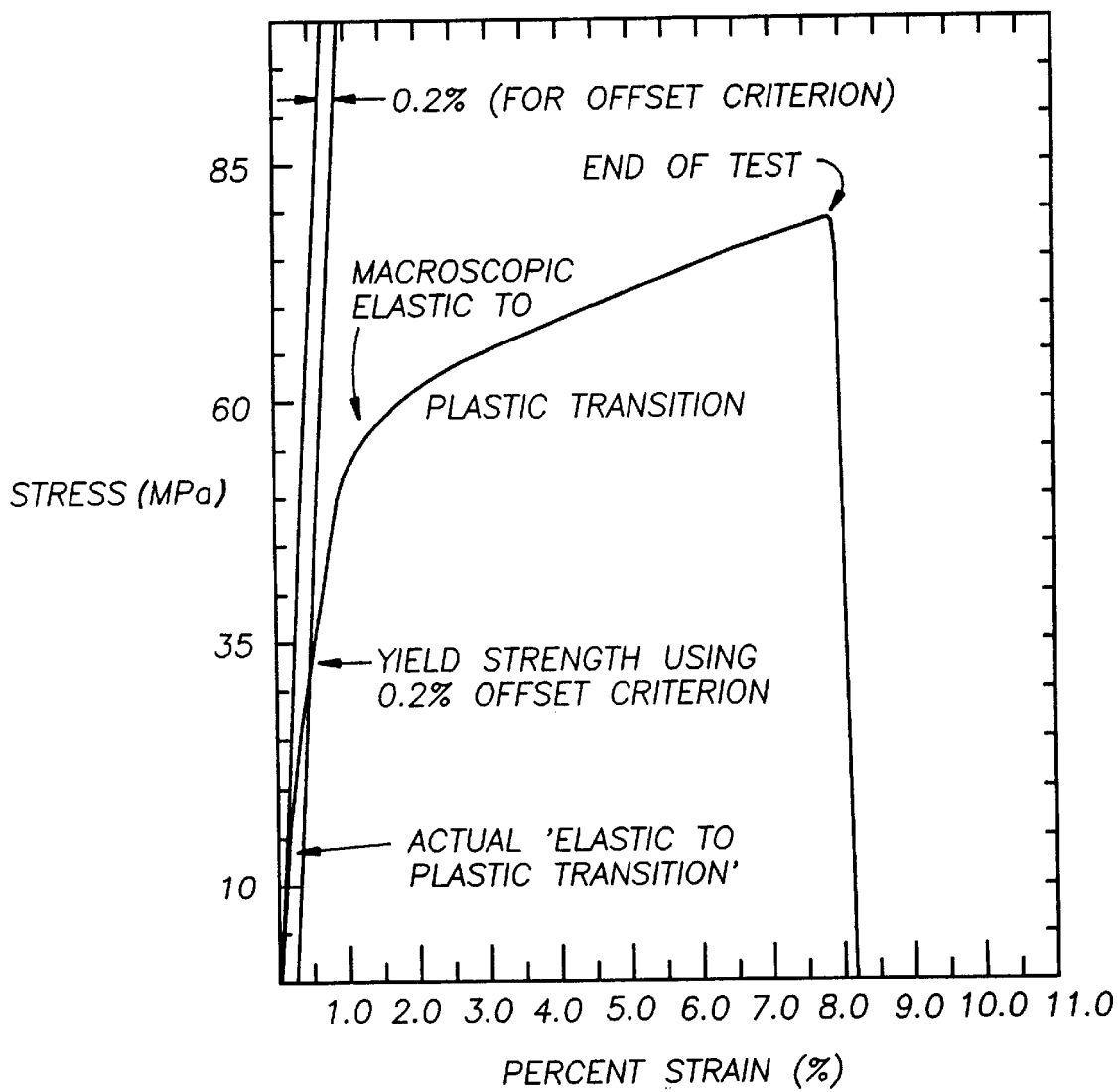
FIG. 5 is a graph showing stress as a function of strain for a composite precursor with a silver matrix prior to a high reduction draft breakdown process.
Figure 7:
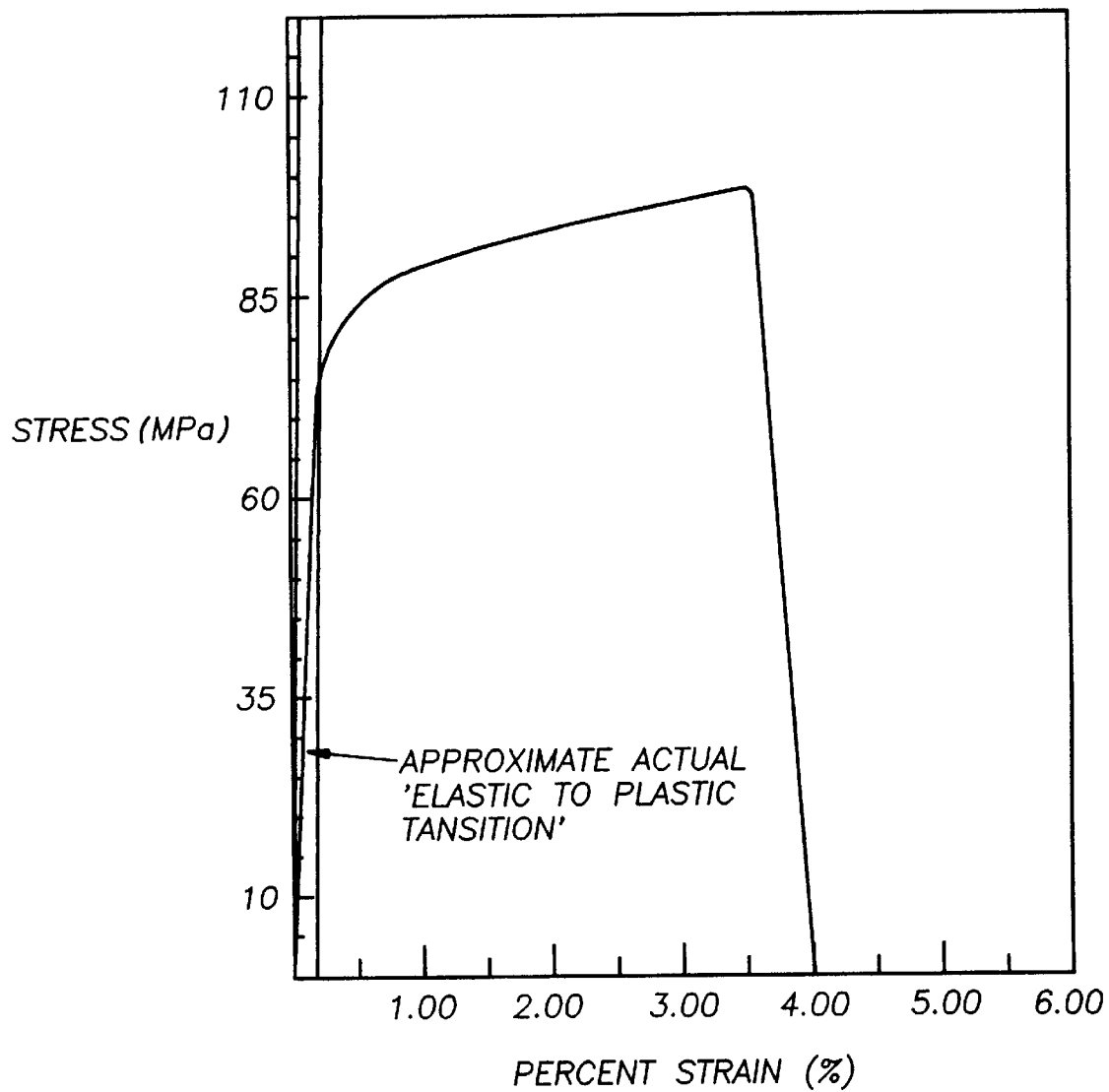
FIG. 7 is a graph showing stress as a function of strain for a composite precursor with a silver and ODS silver matrix prior to a high reduction draft breakdown process.

The inventors have also observed that the maximum acceptable value for the back tension is determined by the precursor composition and geometry, and is approximately the value of the elastic to plastic transition threshold for the composite as a whole, which may be determined in accordance with conventional techniques by plotting the stress to strain curve for the composite and observing the point of deviation from linearity, as illustrated in FIGS. 5 and 7. It should be noted that while the composite, like conventional metals, exhibits elastic and plastic deformation regions, it also possesses a boundary region which is not typical of pure metals. For classic metals, the transition between elastic and plastic behaviors is indicated by the yield strength of the metal, which is conventionally characterized as a 0.2% offset from linear stress to strain behavior. For the composite precursor articles, the inventors have found that conventional yield strength does not accurately reflect either the actual onset of plastic deformation, which occurs at a much lower tension, or the macroscopic transition from elastic to plastic deformation, which occurs at a much higher tension.

For precursor composites with soft matrices, i.e. matrix materials which have not been substantially hardened, such as pure silver, preferred back tensions are preferably less than about 15 MPa. However, the maximum acceptable back tension may be substantially increased if the elastic to plastic threshold is increased prior to the high reduction draft by increasing the overall strength of the composite. Suitable methods of strengthening the composite include, but are not limited to, using harder materials such as ODS silver or silver/gold alloys for all or part of the matrix, cooling the composite to room or cryogenic temperatures, or work hardening the matrix by drawing. However, the inventors have found that hardening only an outer layer of the composite has significantly less impact on the acceptable threshold value than hardening the portions of the matrix separating the filaments. Generally speaking, back tensions up to about 30 MPa, may be used for suitably hardened composites. Regardless of the composite composition, back tensions greater than about 0.2 MPa, and preferably greater than 0.5 MPa are preferred for high speed manufacturing operations.

The inventors have observed experimentally that, during the breakdown stage, controlling back tension during high reduction roll working drafts makes a large and statistically significant contribution to improving composite uniformity without substantial $J_c$ degradation, while controlling back tension during low reduction drafts makes little or no difference in composite quality. Moreover, controlling back tension improves the $J_e$ response surface, providing high performance over a wider range of high reduction draft conditions. These effects are far more significant during the breakdown stage than they are during later stages of deformation processing. The back tension must be maintained well below the yield strength of the composite material although in conventional metal wire processing back tensions in excess of 66% of the yield strength of the wire are routinely employed. While not wishing to be bound by these explanations, the inventors believe that for superconducting composites and their precursors, back tensions above the elastic to plastic threshold value cause incremental elongation which must be accommodated by longitudinal cracks in the filament material. Plastic tensile strains are known to induce cracks perpendicular to the direction of supercurrent flow in composites. The elastic to plastic transition of the composite precursor is very gradual, as shown in FIGS. 5 and 7, but because of the complex structure of the composite material and the large differences in properties between the filament material and the matrix, the first deviation from Hooke's law behavior (the onset of the elastic to plastic transition) is sufficient to damage the composite.

The inventors have observed experimentally that controlled front tensions are also desirable during the high reduction breakdown draft, and that the numerical values of the front tensions selected may be considerably higher than those of the back tension for the draft. While not wishing to be bound by this explanation, the inventors believe that in rolling, the composite precursor undergoes significant work hardening, which raises its elastic to plastic threshold, as suggested by FIGS. 6 and 8. Front tensions of up to 5 times, and preferably about 3 times the selected back tension may be beneficially used in combination with the low back tension. However, the front tension value selected should preferably be below the elastic to plastic threshold of the "as-rolled" composite.

Figure 2:
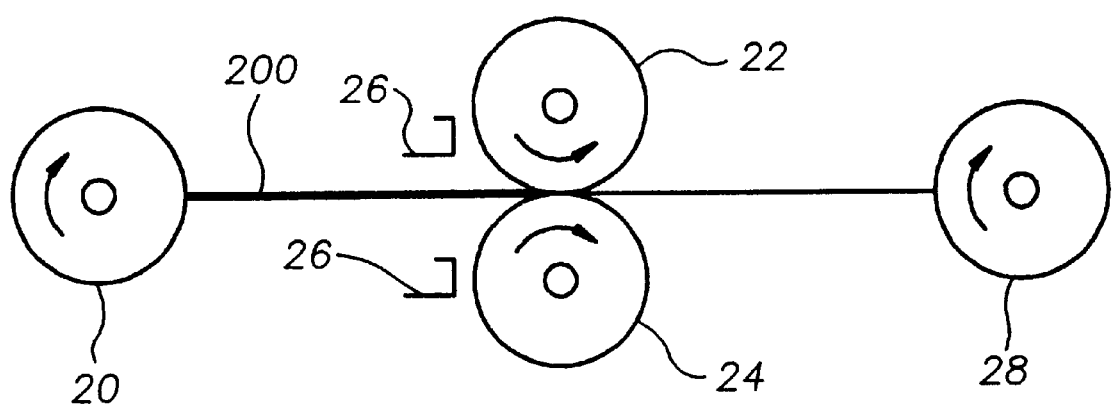
FIG. 2 is a schematic diagram of a rolling apparatus in accordance with the invention.

FIG. 2 is a schematic drawing of rolling equipment in accordance with the invention. Precursor article 200 is delivered to a rolling apparatus through a back tension control device 20, which is preferably a payout roll. In a preferred embodiment, a soft payout roll, such as a cardboard mandrel is used to facilitate continuous slippage, but in other embodiments, a rigid payout roll, the combination of a pair of pinch rollers and a downline feed, or the like may be used. After leaving the tension control device 20, precursor article 200 slides between rollers 22 and 24. In preferred embodiments, the rolls 22 and 24 are equipped with lubrication devices 26. In other preferred embodiments, a front tension control device 28 controls the tension on the article 200 as it leaves the rollers 22 and 24. Front tension control device 28 will typically be a take-up roll, preferably with a rigid mandrel to maintain the higher front tensions preferred for operation of the invention, but may also be a pair of pinch rollers or the like.

The invention may be further understood from the following examples:

EXAMPLE 1

This example illustrates the effect of back tension on dimensional uniformity for an 85 filament precursor composite tape made by a high reduction pass breakdown stage.

A mixture of Bi, Pb, Sr, Ca, and Cu nitrates with metal ratios of 1.74:0.34:1.91:2.03:3.07 was calcined at 650° C. for 0.25–1.5 hours and then ground to reduce the particle size of the oxide powder. The powder was reacted in air at 780–830° C. for 6–10 hours and finally heat treated in pure oxygen at 780–830° C. for 6–10 hours, forming tetragonal BSCCO 2212, $Ca_2PbO_4$ and CuO phases. The powder was packed into a pure silver billet of 1.235" (3.14 cm) OD and 0.765" (1.94 cm) ID. The loaded billet was drawn to a hexagonal monofilament wire of 0.07" (0.18 cm). This wire was cut into 85 equal pieces and bundled into a 0.84" (2.13 cm) OD and 0.76" (1.93 cm) ID silver tube. The bundled 85 filament tube was drawn down to a round wire of 0.0354" (0.9 mm). The wire was then annealed in order to convert the tetragonal BSCCO 2212 to an orthorhombic form, as further described in U.S. patent application Ser. No. 08/467,033 entitled "Processing Of (Bi,Pb) SCCO Superconductor In Wires And Tapes", filed Jun. 6, 1995, which is herein incorporated by reference.

Figure 3:
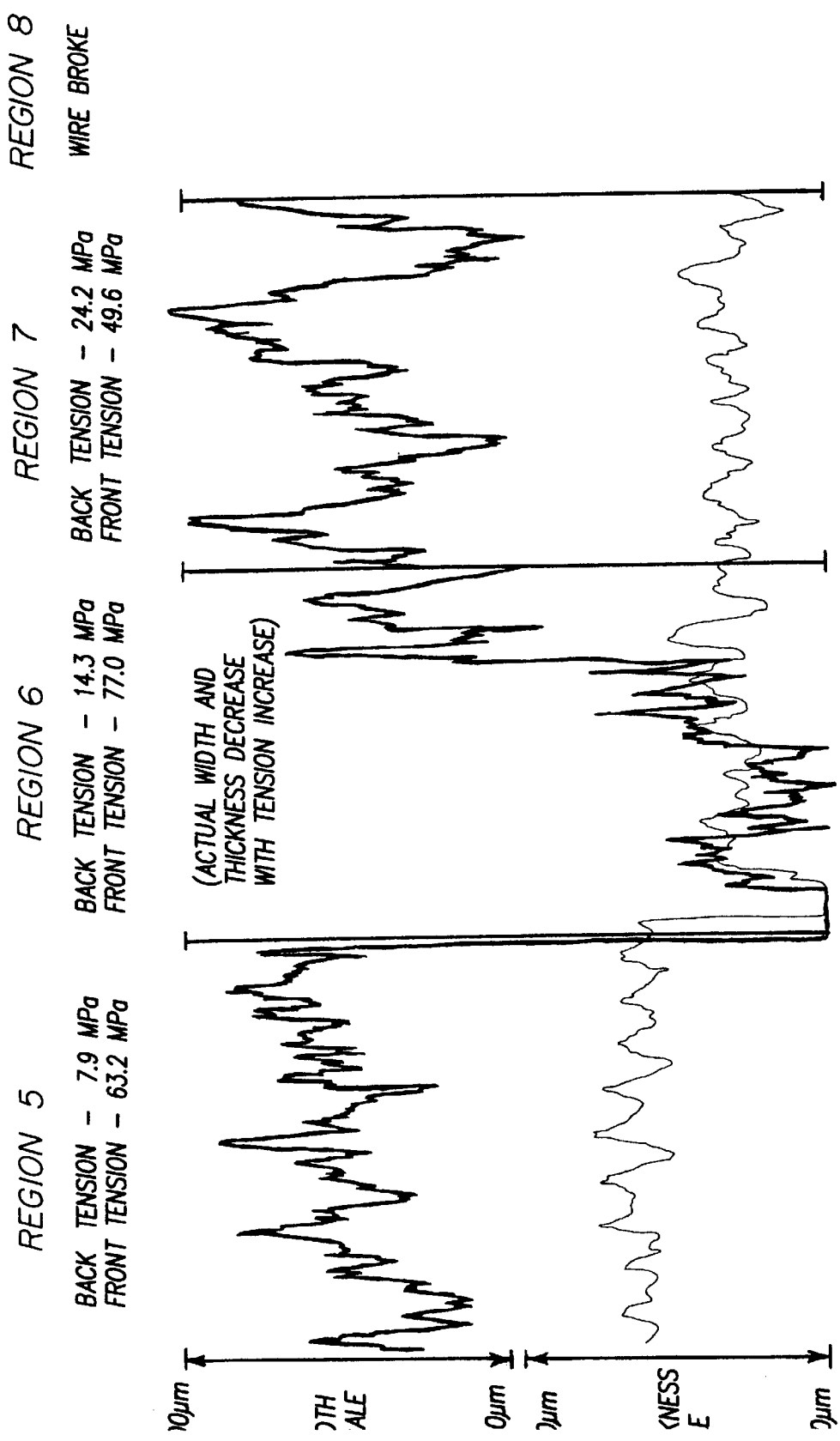
FIG. 3 is a chart showing dimensional variation as a function of back tension for a superconducting ceramic composite.

The sample was rolled into tape by a single stage, high reduction rolling operation using a lubricated four inch (10 cm) roll at a predetermined, constant reduction of about 84% using rigid tension controls for both front and back tension. During the rolling operation, front and back tension were varied incrementally, with increasing back tension. The three sets of tensions applied were back tension of 7.9 MPa and a front tension of 63.2 MPa (Region 5 of FIG. 3; a back tension of 14.3 MPa and a front tension of 77 MPa (Region 6 of FIG. 3; and a back tension of 24.2 MPa and a front tension of 49.6 MPa (Region 7 of FIG. 3), where the tape broke.

An electric chart recorder and a pair of precision real-time thickness (Volmer brand) gauges were connected to the rolling mill. After being rolled, the tape passed through these gauges, providing real-time thickness and width measurements, in micrometers, which are shown in the chart in FIG. 3. Throughout the range of back tensions measured, lower back tensions are associated with better dimensional uniformity.

EXAMPLE 2

This example illustrates the effect of back tension on $J_c$ for an 85 filament superconducting composite oxide tape made by a high reduction pass breakdown stage.

A monofilamentary wire containing tetragonal BSCCO 2212, $Ca_2PbO_4$ and CuO phases was made in accordance with Example 1 above. The powder was packed into a pure silver billet of 1.235" (3.14 cm) OD and 0.765" (1.94 cm) ID. The loaded billet was drawn to a hexagonal monofilament wire of 0.07" (0.18 cm). This wire was cut into 85 equal pieces and bundled into a 0.84" (2.13 cm) OD and 0.76" (1.93 cm) ID silver tube. The bundled 85 filament tube was drawn down to a round wire of 0.0354" (0.9 mm). The wire was annealed as described above in order to convert the tetragonal BSCCO 2212 to an orthorhombic form.

The sample was divided and rolled into tape by a single stage, high reduction rolling operation using a lubricated four inch (10 cm) roll at a predetermined, constant roll gap of 83% (Nalco lubricant), 83.5% (10W-40 lubricant), or 84% (10W–40 lubricant). During the rolling operation, the back tension was varied in increments from a very low value, from less than about 0.5 MPa to a value of about 25 MPa. The nominal front load was kept between 1 and 3 kg. At less than about 0.5 MPa, a cardboard washer with low tension was used to control payoff, while for back tensions greater than about 1.0 MPa, a rigid payoff was used. Back tension was measured using a calibrated load cell, and it was observed that the standard deviation of the measured loads declined significantly as the back tension increased, with standard deviations on the order of 5% observed for rigid payoffs and on the order of 50% observed for cardboard washers.

After being rolled, the tape consisted of a series of steady state regions, each corresponding to a particular back tension, with transition regions corresponding to periods of back tension adjustment in between the steady state regions.

Figure 4:
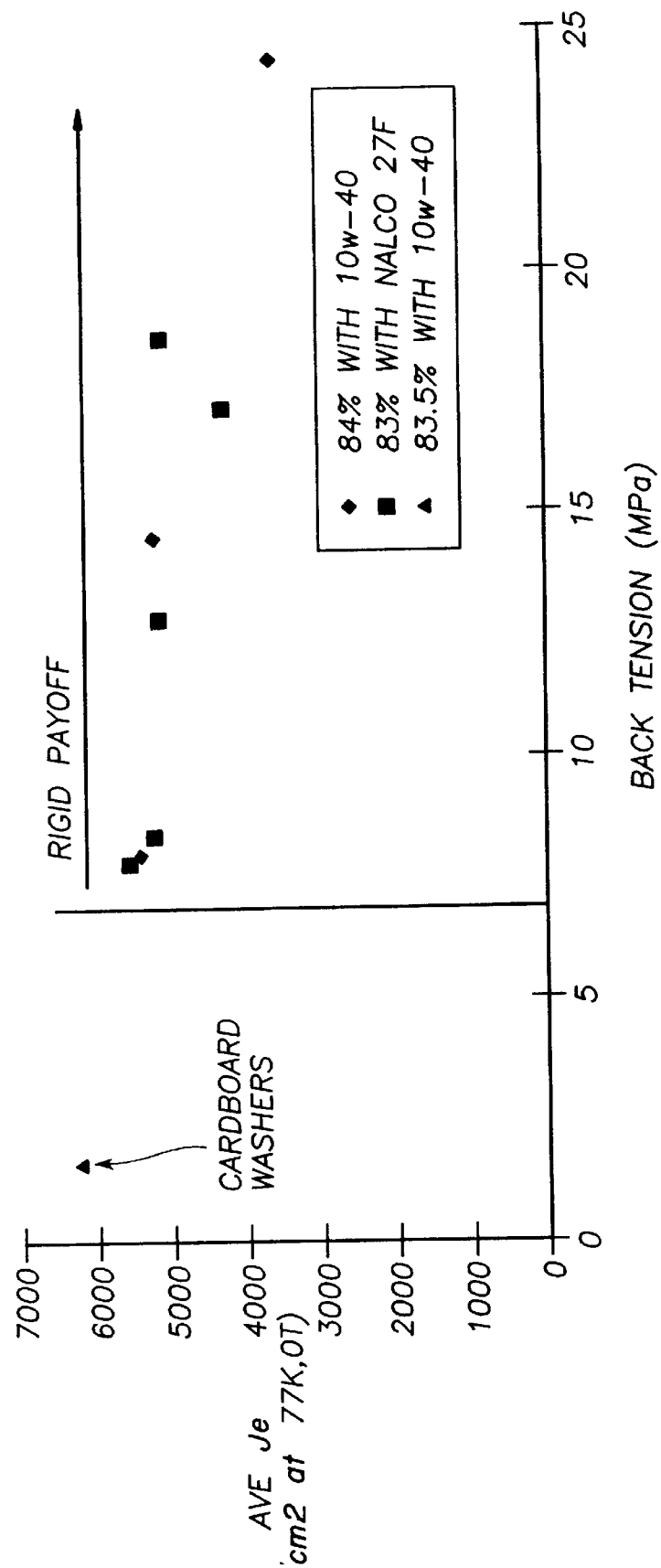
FIG. 4 is a graph showing average $J_c$ as a function of back tension for samples manufactured by three high reduction draft breakdown processes.

The sample was then sintered at 790–850° C. for 1 to 100 hours and 650–790° C. for 10 to 100 hours, all in a nitrogen atmosphere with 7.5% oxygen. The average $J_e$ of for each steady state region of this tape was measured by taking average Ic measurements on each region at 77K in self field. FIG. 4 is a graph showing average $J_c$ as a function of back tension for the samples. Je decreases as back tension increases from about 2 MPa to about 25 MPa, with the rate of change rising as back tension rises above about 10 MPa.

EXAMPLE 3

This example illustrates the elastic to plastic threshold for an 85 filament superconducting composite oxide tape with a pure silver matrix made by a high reduction pass breakdown stage.

A monofilamentary wire containing tetragonal BSCCO 2212, $Ca_2PbO_4$ and CuO phases was made in accordance with Example 1 above. The powder was packed into a pure silver billet of 1.235" (3.14 cm) OD and 0.906" (2.30 cm) ID. The loaded billet was drawn to a hexagonal monofilament wire of 0.070" (0.18 cm). This wire was cut into 85 equal pieces and bundled into a 0.0840" (0.21 cm) OD and 0.0760" (0.19 cm) ID silver tube. The bundled filament tube was drawn down to a round wire of 0.0393" (0.1 cm). The wire was annealed as described in the Examples above in order to convert the tetragonal BSCCO 2212 to an orthorhombic form. Samples were then taken for uniaxial tensile testing. The remaining material was then rolled into 0.01" (0.196 mm) thick tapes using a four inch (10 cm) roll. Five samples were then taken for uniaxial tensile testing.

FIG. 5 is a graph showing stress as a function of strain for a composite precursor with a silver matrix prior to a high reduction draft breakdown process. The elastic to plastic transition threshold occurs at a stress (back tension) of under about 15 MPa, although the yield strength of the tape using the conventional 0.2% offset criterion is much higher, at a stress of under about 35 MPa. The macroscopic elastic to plastic transition occurs at a stress of about 55–60 MPa.

Figure 6:
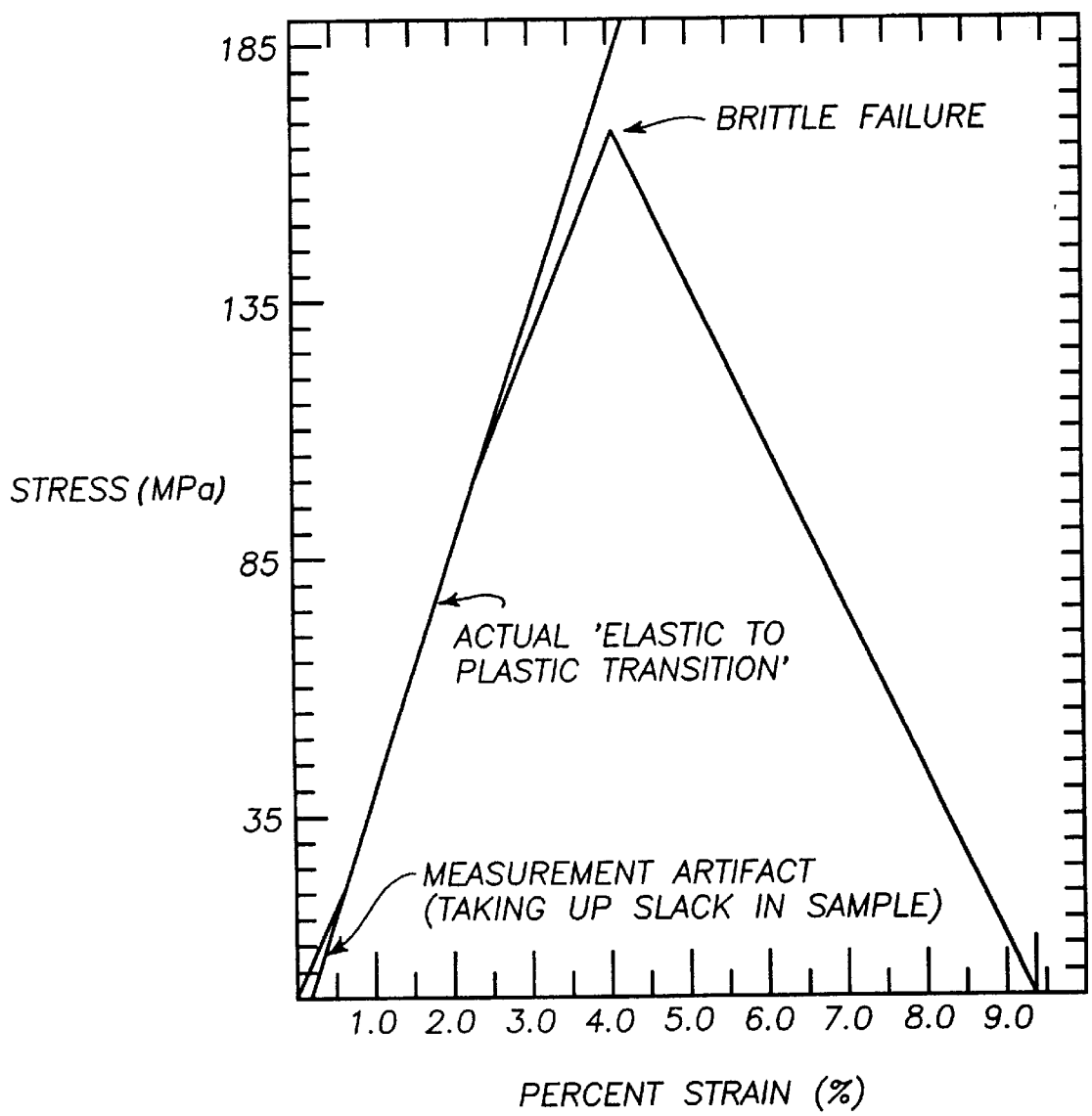
FIG. 6 is a graph showing stress as a function of strain for the composite precursor of FIG. 5 after a high reduction draft breakdown process.

FIG. 6 is a graph showing stress as a function of strain for the composite precursor of FIG. 5 after a high reduction draft breakdown process. The rolled precursor exhibits very different behavior, which the inventors attribute to work hardening during the rolling process. The elastic to plastic transition threshold occurs at a stress of about 100 MPa, and there is brittle failure of the composite at much lower strains than were tolerated by the unrolled precursor article.

EXAMPLE 4

This example illustrates the elastic to plastic threshold for an 85 filament superconducting composite oxide tape with a part ODS silver matrix made by a high reduction pass breakdown stage.

A monofilamentary wire containing tetragonal BSCCO 2212, $Ca_2PbO_4$ and CuO phases was made in accordance with Example 1 above. The powder was packed into a double billet containing a pure silver inner layer of 1.050" (2.67 cm) OD and 0.906" (2.30 cm) ID and a copper outer layer of 1.235" (3.14 cm) ID and 1.060" (2.69 cm) OD. The loaded billet was drawn to a hexagonal monofilament wire of 0.70" (1.78 cm), and the copper etched away. This wire was cut into 121 equal pieces and bundled into a 1.030" (2.62 cm) OD and 0.906" (2.30 cm) ID tube of silver with 0.09 wt % of aluminum. The bundled filament tube was drawn down to a round wire of 0.0369" (0.09 cm). The wire was annealed as described above in order to convert the tetragonal BSCCO 2212 to an orthorhombic form. Samples were then taken for uniaxial tensile testing. The remaining material was then rolled into 0.01" (0.196 mm) thick tapes using a four inch (10 cm)roll. Five samples were then taken for uniaxial tensile testing.

FIG. 7 is a graph showing stress as a function of strain for a composite precursor with a silver and ODS silver matrix prior to a high reduction draft breakdown process. The elastic to plastic transition threshold occurs at a stress (back tension) of under about 30 MPa, although the yield strength of the tape using the conventional 0.2% offset criterion is much higher, at a stress of under about 75 MPa. The macroscopic elastic to plastic transition occurs at a stress of about 75–80 MPa.

Figure 8:
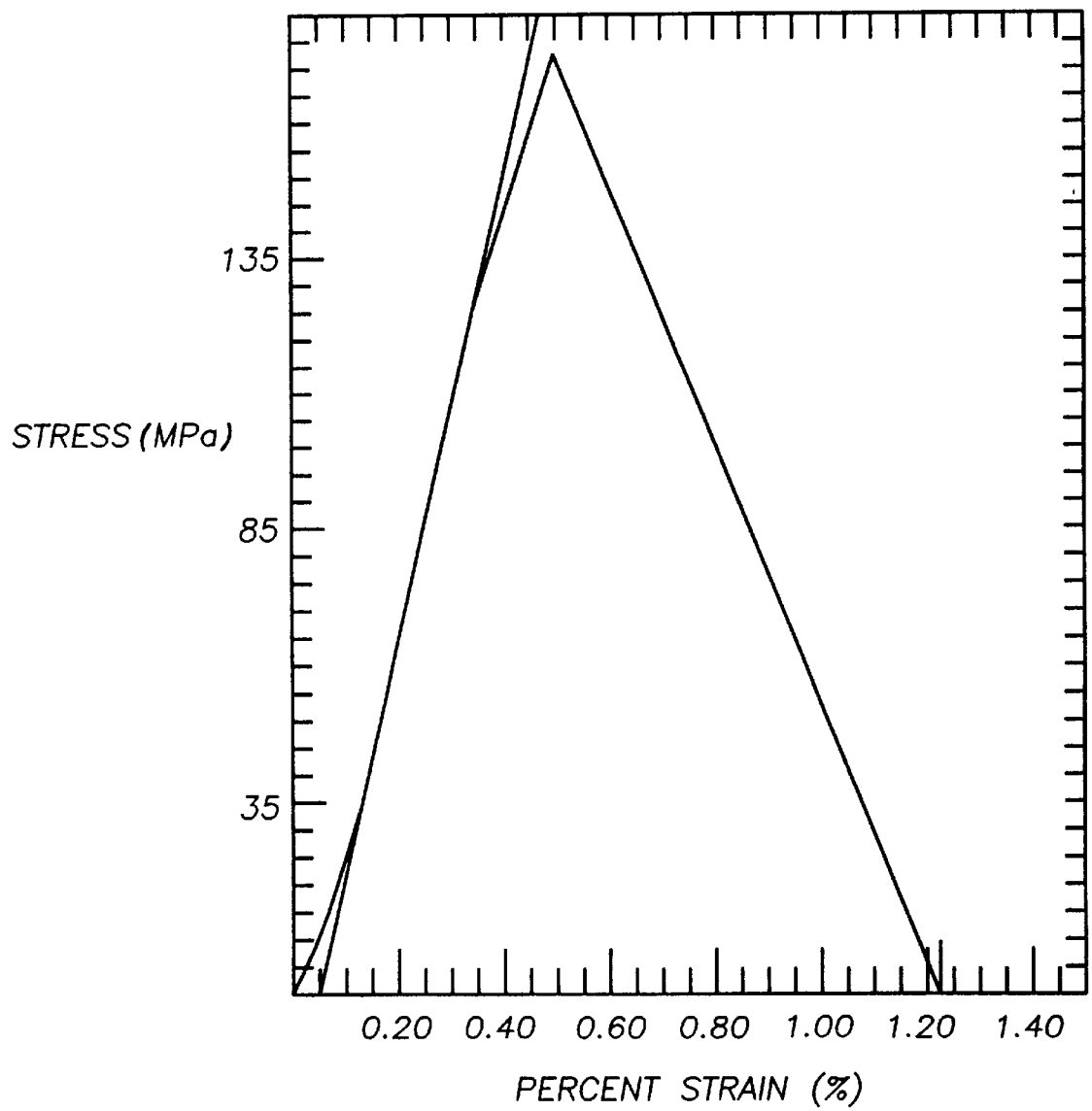
FIG. 8 is a graph showing stress as a function of strain for the composite of FIG. 7 after a high reduction draft breakdown process.

FIG. 8 is a graph showing stress as a function of strain for the composite of FIG. 7 after a high reduction draft breakdown process. The rolled precursor exhibits very different behavior, which the inventors attribute to work hardening during the rolling process. The elastic to plastic transition threshold occurs at a stress of about 125 MPa, and there is brittle failure of the composite at much lower strains than were tolerated by the unrolled precursor article.

EXAMPLE 5

This example illustrates the effect of varying front tension for an 85 filament superconducting composite oxide tape made by multiple low reductiondrafts in the breakdown stage. The effect of tension on $J_c$ is much less pronounced than in the previous examples.

A mixture of Bi, Pb, Sr, Ca, and Cu nitrates with metal ratios of 1.74:0.34:1.91:2.03:3.07 was calcined at 650C for 0.25–1.5 hours and then ground to reduce the particle size of the oxide powder. The powder was reacted in air at 780–830° C. for 6–10 hours and finally heat treated in pure oxygen at 780–830° C. for 6–1 hours, forming tetragonal BSCCO 2212, Ca2PbO4 and CuO phases. The powder was packed into a pure silver billet of 1.235" (3.14 cm) OD and 0.846" (2.15 cm) ID. The loaded billet was drawn to a hexagonal monofilament wire of 0.07" (0.18 cm).

This wire was cut into 85 equal pieces and bundled into a 0.84" (2.13 cm) OD and 0.760" (1.93 cm) ID silver tube. The bundled 85 filament tube was drawn down to a round wire of 0.072" (0.18 cm) annealed at 300–500° C for 0.5–1.5 hours.

All samples were rolled into 0.0143" (4 mm) thick tapes by a multidraft breakdown rolling sequence using 0.75 inch (1.91 cm) rolls at about 6% reduction during each draft, with one intermediate anneal as described above. One pair of samples were rolled at 18 lbs front tension and 4 lbs back tension (A series). The second pair were rolled at 13 lbs front tension and 4 lbs back tension (B series). The third pair were rolled at 8 lbs front tension and 4 lbs back tension (C series). On completion of the breakdown stage, there were three classes of two segments each.

The samples were then sintered at 790–850° C. for 1 to 100 hours in a nitrogen atmosphere with 7.5% oxygen. A first intermediate reduction stage of 17% was performed by roll working in a single draft on the four inch rolls. These segments were then sintered at 790–850° C. for 1 to 100 hours and 650–750° C. for 10 to 100 hours, all in a nitrogen atmosphere with 7.5% oxygen. A second intermediate reduction stage of 14% was performed by roll working each class of segments in a single draft on the four inch rolls. The segments were then sintered at 790–850° C. for 1 to 100 hours and 650–790° C. for 10 to 100 hours, all in a nitrogen atmosphere with 7.5% oxygen. In each intermediate stage, one sample from each class was rolled at 13 lbs front tension and 6 lbs back tension (2 series) while the second sample from each class was rolled at 3 lbs front tension and 3 lbs back tension (5 series).

Figure 9:
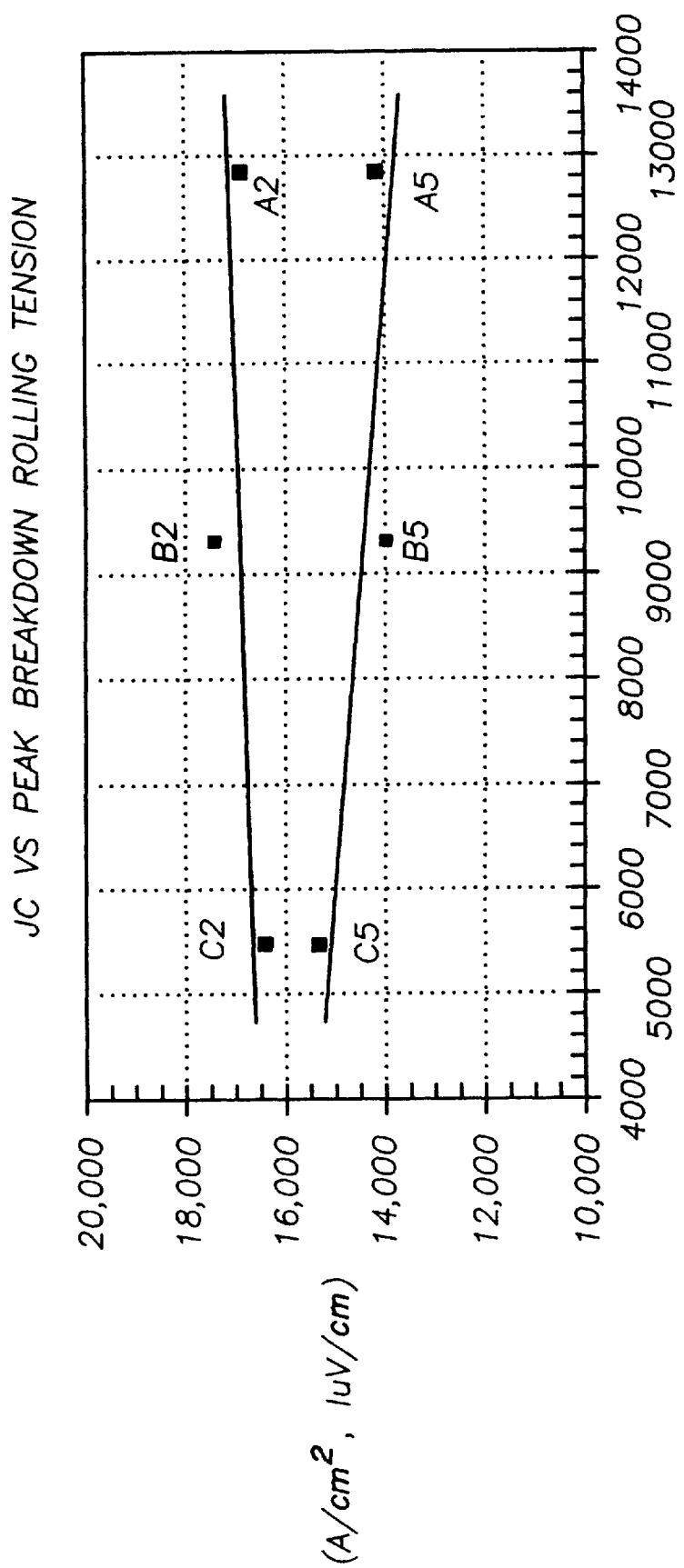
FIG. 9 shows the average Je for a superconducting ceramic composite as a function of front and back tension at various combinations of processing conditions.

FIG. 9 shows the average $J_e$ at 77K in self field as a function of front and back tension for the samples at the various combinations of processing conditions. Points are designated by the letter and number combination which indicates the tension conditions during the breakdown and intermediate stages. Thus, for example, C-2 indicates that the sample was rolled at 8 lbs front tension and 4 lbs back tension during the breakdown stage, and at 13 lbs front tension and 6 lbs back tension during the intermediate stages. The inventors attribute the relative invariance of $J_e$ relative to breakdown tensions to the low reduction draft process employed in this example.

It should be readily apparent to those skilled in the art that the methods and advantages of the present invention may be used in all multifilamentary superconducting articles having a variety of compositions and morphologies. The description and examples are set forth in the specification for the purposes of illustration only and are by no means intended to be limiting of the invention. The scope and nature of the invention are set forth in the claims which follow.

What is claimed is:

1. A method for manufacturing a multifilamentary superconducting ceramic composite article comprising:

providing a precursor article comprising a plurality of filaments extending along the length of the article and containing precursors to a desired superconducting ceramic, and a metal matrix substantially surrounding each filament;

roll working the precursor article during a breakdown stage at a back tension less than the elastic to plastic transition threshold of the precursor article during at least one roll working draft, and sintering the rolled article to obtain the desired superconducting ceramic composite article, the rolled and sintered composite article having substantially uniform filaments and substantially uniform outer dimensions.

2. A method according to claim 1 wherein the maxtrix contains ODS silver or a silver alloy and the back tension is less than about 30 MPa during each roll working draft.

3. A method according to claim 2 wherein the matrix is substantially pure silver and the back tension is less than about 15 MPa during each roll working draft.

4. A method according to claim 1 wherein the desired superconducting ceramic is a superconducting oxide.

5. A method according to claim 4 wherein the desired superconducting oxide is one of the bismuth-strontium-calcium-copper-oxide superconducting phases.

6. The method of claim 1, wherein the roll working draft is a high reduction draft in which a reduction of at least 40% occurs.

7. A method according to claim 4 wherein the desired superconducting oxide is one of the barium-strontium-calcium-copper-oxide superconducting phases.

8. A method according to claim 6 wherein there are a plurality of high reduction roll working drafts during the breakdown stage.

9. A method according to claim 6 in which there is only one high reduction roll working draft during the breakdown stage.

10. A method according to claim 9 wherein no further reduction of the article in excess of about 10% occurs during the breakdown stage after the high reduction roll working draft and before the sintering operation.

11. A method according to claim 10 wherein no further reduction of the article in excess of about 5% occurs during the breakdown stage after the high reduction roll working draft and before the sintering operation.

12. A method according to claim 1 which is an nDS process.

13. A method according to claim 11 wherein n is an integer no less than 1 and no greater than 5.

14. A method according to claim 1 wherein the back tension is greater than about 0.2 MPa during each roll working draft.

15. A method according to claim 1 wherein the back tension is greater than about 0.5 MPa during each roll working draft.

16. A method according to claim 5 wherein the desired superconducting oxide is BSCCO 2223.

17. A method according to claim 5 wherein the desired superconducting oxide is BSCCO 2212.

18. A method according to claim 4 wherein the desired superconducting oxide is one of the yttrium-barium-copper-oxide superconducting phases.

19. A method according to claim 1 wherein the rolling step further comprises rolling the article at a front tension less than the elastic to plastic transition threshold of the rolled, unsintered article.

20. A method according to claim 19 wherein the front tension applied is less than about five times the value of the back tension applied.

21. A method according to claim 19 wherein the front tension applied is less than about three times the value of the back tension applied.

* * * * *